United States Patent
Ko et al.

(10) Patent No.: US 12,326,476 B2
(45) Date of Patent: Jun. 10, 2025

(54) BATTERY SWELLING INSPECTION APPARATUS AND METHOD

(71) Applicant: LG ENERGY SOLUTION, LTD., Seoul (KR)

(72) Inventors: Dong-Wan Ko, Daejeon (KR); Do-Yul Kim, Daejeon (KR); Ki-Young Lee, Daejeon (KR)

(73) Assignee: LG ENERGY SOLUTION, LTD., Seoul (KR)

( * ) Notice: Subject to any disclaimer, the term of this patent is extended or adjusted under 35 U.S.C. 154(b) by 325 days.

(21) Appl. No.: 17/791,069

(22) PCT Filed: Apr. 29, 2021

(86) PCT No.: PCT/KR2021/005473
§ 371 (c)(1),
(2) Date: Jul. 6, 2022

(87) PCT Pub. No.: WO2021/246654
PCT Pub. Date: Dec. 9, 2021

(65) Prior Publication Data
US 2023/0025923 A1    Jan. 26, 2023

(30) Foreign Application Priority Data
Jun. 3, 2020    (KR) .................. 10-2020-0067294

(51) Int. Cl.
G01R 31/392    (2019.01)
G01B 5/30      (2006.01)
H01M 10/42     (2006.01)

(52) U.S. Cl.
CPC ............. *G01R 31/392* (2019.01); *G01B 5/30* (2013.01); *H01M 10/4285* (2013.01); *H01M 2200/20* (2013.01)

(58) Field of Classification Search
None
See application file for complete search history.

(56) References Cited

U.S. PATENT DOCUMENTS

2014/0311223 A1* 10/2014 Baba ............... G01M 3/363
                                                  73/49.8
2018/0113048 A1  4/2018 Baba et al.
(Continued)

FOREIGN PATENT DOCUMENTS

CN    104112880 A    10/2014
EP    4 092 802 A1   11/2022
(Continued)

OTHER PUBLICATIONS

Machine translation of KR20170042082A (Year: 2017).*
(Continued)

*Primary Examiner* — Matthew G Marini
(74) *Attorney, Agent, or Firm* — Birch, Stewart, Kolasch & Birch, LLP

(57) ABSTRACT

Discussed is a battery swelling inspection apparatus, including an upper plate; a lower plate located to face the upper plate; a fixing frame to which a portion of the upper plate and a portion of the lower plate are fixedly coupled thereto; a pressure measurer located on at least one of an upper portion and a lower portion of the lower plate and to measure a first pressure value applied from the battery toward the lower plate; and a pressure measuring pad having a coupling surface and a measuring surface, the coupling surface coupled to a lower surface of the upper plate or an upper surface of the lower plate and the measuring surface located at a side opposite to the coupling surface to face the battery and a pressure being applied from the battery to at least a portion of the measuring surface.

14 Claims, 10 Drawing Sheets

(56) References Cited

U.S. PATENT DOCUMENTS

| | | | |
|---|---|---|---|
| 2018/0261824 | A1 | 9/2018 | Ju et al. |
| 2019/0094003 | A1 | 3/2019 | Kim et al. |
| 2023/0049302 | A1 | 2/2023 | Kim et al. |

FOREIGN PATENT DOCUMENTS

| | | | |
|---|---|---|---|
| JP | 2010-32492 A | | 2/2010 |
| JP | 4655568 B2 | | 3/2011 |
| JP | 5444762 B2 | | 3/2014 |
| KR | 10-2015-0035268 A | | 4/2015 |
| KR | 10-2016-0064871 A | | 6/2016 |
| KR | 10-2017-0041538 A | | 4/2017 |
| KR | 10-2017-0042082 A | | 4/2017 |
| KR | 10-2018-0103591 A | | 9/2018 |
| KR | 10-2018-0136192 A | | 12/2018 |
| KR | 10-2019-0090291 A | | 8/2019 |
| KR | 10-1983849 B1 | | 9/2019 |
| KR | 10-2020-0008834 A | | 1/2020 |
| KR | 10-2070684 B1 | | 1/2020 |
| WO | WO 2017/087807 A1 | | 5/2017 |

OTHER PUBLICATIONS

Machine translation of KR101983849 (Year: 2019).*
English Machine Translation for KR 10-1983849 81, dated Sep. 3, 2019.
Extended European Search Report for European Application No. 21818521.3, dated Aug. 4, 2023.
International Search Report for PCT/KR2021/005473 mailed on Aug. 19, 2021.

* cited by examiner

BATTERY SWELLING INSPECTION APPARATUS AND METHOD

TECHNICAL FIELD

The present application claims priority to Korean Patent Application No. 10-2020-0067294 filed on Jun. 3, 2020 in the Republic of Korea, the disclosures of which are incorporated herein by reference.

The present disclosure relates to a battery swelling inspection apparatus and method, and more particularly, to a battery swelling inspection apparatus and method capable of inspecting swelling of a battery cell.

BACKGROUND ART

Recently, the demand for portable electronic products such as notebook computers, video cameras and portable telephones has increased sharply, and electric vehicles, energy storage batteries, robots, satellites and the like have been developed in earnest. Accordingly, high-performance batteries allowing repeated charging and discharging are being actively studied.

Batteries commercially available at present include nickel-cadmium batteries, nickel-hydrogen batteries, nickel-zinc batteries, lithium batteries and the like. Among them, the lithium batteries are in the limelight since they have almost no memory effect compared to nickel-based batteries and also have very low self-charging rate and high energy density.

Such a battery may cause swelling in which gas is generated in the battery during charging and discharging or in a high temperature state to inflate the battery. Since there is a risk of fire or explosion due to battery swelling, it is important to accurately inspect the swelling behavior of the battery.

Conventionally, a device for inspecting swelling of a battery using a plurality of load cells has been disclosed (Patent Document 1). Referring to Patent Document 1, a first plate, a plurality of load cells, a second plate, a measurement target (a battery cell) and a third plate are stacked, and the first plate, the second plate and the third plate are fixed using a plurality of fastening members. In particular, since the second plate provided between the battery cell and the plurality of load cells is fixed by the fastening member, the swelling pressure of each region of the battery cell transmitted to the plurality of load cells is inevitably lost seriously. That is, in Patent Document 1, since the movement of the second plate caused by the swelling pressure is restricted by the fastening member, there is a limitation in that the swelling of the battery cell may not be accurately inspected.

In addition, referring to FIG. 9 of Patent Document 1, a structure in which the second plate is composed of a plurality of partial flat plates and the partial flat plates are connected to each other by a connection unit is disclosed. Since the partial flat plates are connected to each other, there is a problem that the swelling pressure applied to one of the partial flat plates may affect the other partial flat plates.

In addition, the plurality of partial flat plates of Patent Document 1 are restricted to each other by the connecting unit made of a material having elasticity or ductility. That is, if a swelling pressure is applied to any one partial flat plate, the swelling pressure is not transmitted only to the load cell located in a lower direction, but is distributed through the connection unit.

Considering the above, there is a problem that the pressure of the battery cell measured by the battery cell pressure measuring device disclosed in Patent Document 1 may be inaccurate.

(Patent Document 1) KR 10-2017-0042082 A

DISCLOSURE

Technical Problem

The present disclosure is designed to solve the problems of the related art, and therefore the present disclosure is directed to providing a battery swelling inspection apparatus and method capable of inspecting a swelling distribution of a battery and/or a swelling pressure of each region of the battery.

These and other objects and advantages of the present disclosure may be understood from the following detailed description and will become more fully apparent from the exemplary embodiments of the present disclosure. Also, it will be easily understood that the objects and advantages of the present disclosure may be realized by the means shown in the appended claims and combinations thereof.

Technical Solution

A battery swelling inspection apparatus according to an aspect of the present disclosure may comprise: an upper plate configured in a plate shape; a lower plate configured in a plate shape and located to face the upper plate, the lower plate being configured such that a battery is seated thereon; a fixing frame configured such that a portion of the upper plate and a portion of the lower plate are fixedly coupled thereto; a pressure measuring unit located on at least one of an upper portion and a lower portion of the lower plate and configured to measure a first pressure value applied from the battery toward the lower plate; and a pressure measuring pad having a coupling surface configured to be coupled to a lower surface of the upper plate or an upper surface of the lower plate and a measuring surface located at a side opposite to the coupling surface to face the battery and configured such that a pressure is applied to at least a portion thereof, the pressure measuring pad being configured to measure a pressure distribution of the measuring surface based on the pressure applied from the battery to at least a portion of the measuring surface and a preset reference value.

A battery swelling inspection apparatus according to another aspect of the present disclosure may further comprise a processor connected to the pressure measuring unit and the pressure measuring pad to obtain the first pressure value and the pressure distribution and configured to calculate a plurality of second pressure values applied to each portion of the measuring surface according to the obtained first pressure value and the obtained pressure distribution and detect whether the battery swells based on the plurality of calculated second pressure values.

The processor may be configured to calculate an absolute pressure value applied to the measuring surface by substituting the pressure distribution according to the first pressure value and calculate the plurality of second pressure values based on the calculated absolute pressure value and the pressure distribution, respectively.

The pressure measuring unit may include a first pressure measuring unit located below the lower plate and having a head located to face a lower surface of the lower plate, the first pressure measuring unit being configured to measure the first pressure value applied to the head.

The pressure measuring pad may be configured such that the coupling surface is coupled to the lower surface of the upper plate.

The pressure measuring unit may include a second pressure measuring unit having a plurality of pressure measuring elements coupled to the upper surface of the lower plate and configured to measure the first pressure value based on a unit pressure value measured by each of the plurality of pressure measuring elements.

The pressure measuring unit may further include a third pressure measuring unit located below the lower plate and having a head located to face a lower surface of the lower plate, the third pressure measuring unit being configured to measure a third pressure value applied to the head.

The processor may be connected to the second pressure measuring unit to obtain the first pressure value, be connected to the third pressure measuring unit to obtain the third pressure value, and be configured to correct the third pressure value based on the first pressure value.

The processor may be configured to calculate the plurality of second pressure values based on the corrected third pressure value and the pressure distribution.

The processor may be configured to detect at least one of a swelling distribution of the battery and a swelling pressure of each region, based on the obtained pressure distribution and the plurality of calculated second pressure values.

The pressure measuring pad may be configured to measure a relative pressure distribution with respect to the pressure applied to the measuring surface by using the reference value as a threshold value.

A battery manufacturing device according to still another aspect of the present disclosure may comprise the battery swelling inspection apparatus according to an aspect of the present disclosure.

A battery swelling inspection method for inspecting swelling of a battery interposed between an upper plate and a lower plate configured in a plate shape according to still another aspect of the present disclosure may comprise: a first pressure measuring step of, by a pressure measuring unit located on at least one of an upper portion and a lower portion of the lower plate and configured to measure a first pressure value applied from the battery toward the lower plate, measuring the first pressure value applied from the battery toward the lower plate; a pressure distribution measuring step of, by a pressure measuring pad having a coupling surface configured to be coupled to a lower surface of the upper plate or an upper surface of the lower plate and a measuring surface located at a side opposite to the coupling surface to face the battery and configured such that a pressure is applied to at least a portion thereof, measuring a pressure distribution of the measuring surface based on the pressure applied from the battery to at least a portion of the measuring surface and a preset reference value; a second pressure measuring step of, by a processor, calculating a plurality of second pressure values applied to each portion of the measuring surface according to the first pressure value and the pressure distribution; and a swelling inspection step of, by the processor, detecting whether the battery swells based on the plurality of calculated second pressure values.

Advantageous Effects

According to one aspect of the present disclosure, the swelling pressure and swelling distribution for each local area of the battery may be detected. Therefore, the battery swelling inspection apparatus has an advantage of more accurately and precisely inspecting the swelling of the battery.

The effects of the present disclosure are not limited to the effects mentioned above, and other effects not mentioned will be clearly understood by those skilled in the art from the description of the claims.

DESCRIPTION OF DRAWINGS

The accompanying drawings illustrate a preferred embodiment of the present disclosure and together with the foregoing disclosure, serve to provide further understanding of the technical features of the present disclosure, and thus, the present disclosure is not construed as being limited to the drawing.

BEST MODE

It should be understood that the terms used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the description proposed herein is just a preferable example for the purpose of illustrations only, not intended to limit the scope of the disclosure, so it should be understood that other equivalents and modifications could be made thereto without departing from the scope of the disclosure.

Additionally, in describing the present disclosure, when it is deemed that a detailed description of relevant known elements or functions renders the key subject matter of the present disclosure ambiguous, the detailed description is omitted herein.

The terms including the ordinal number such as "first", "second" and the like, may be used to distinguish one element from another among various elements, but not intended to limit the elements by the terms.

Throughout the specification, when a portion is referred to as "comprising" or "including" any element, it means that the portion may include other elements further, without excluding other elements, unless specifically stated otherwise.

Furthermore, the term "processor" described in the specification refers to a unit that processes at least one function or operation, and may be implemented by hardware, software, or a combination of hardware and software.

In addition, throughout the specification, when a portion is referred to as being "connected" to another portion, it is not limited to the case that they are "directly connected", but it also includes the case where they are "indirectly connected" with another element being interposed between them.

Hereinafter, preferred embodiments of the present disclosure will be described in detail with reference to the accompanying drawings.

Figure 1:
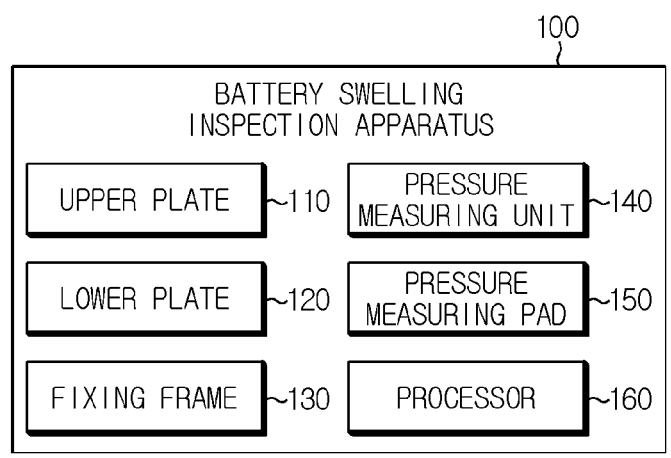
FIG. 1 is a diagram schematically showing a battery swelling inspection apparatus according to an embodiment of the present disclosure.
Figure 2:
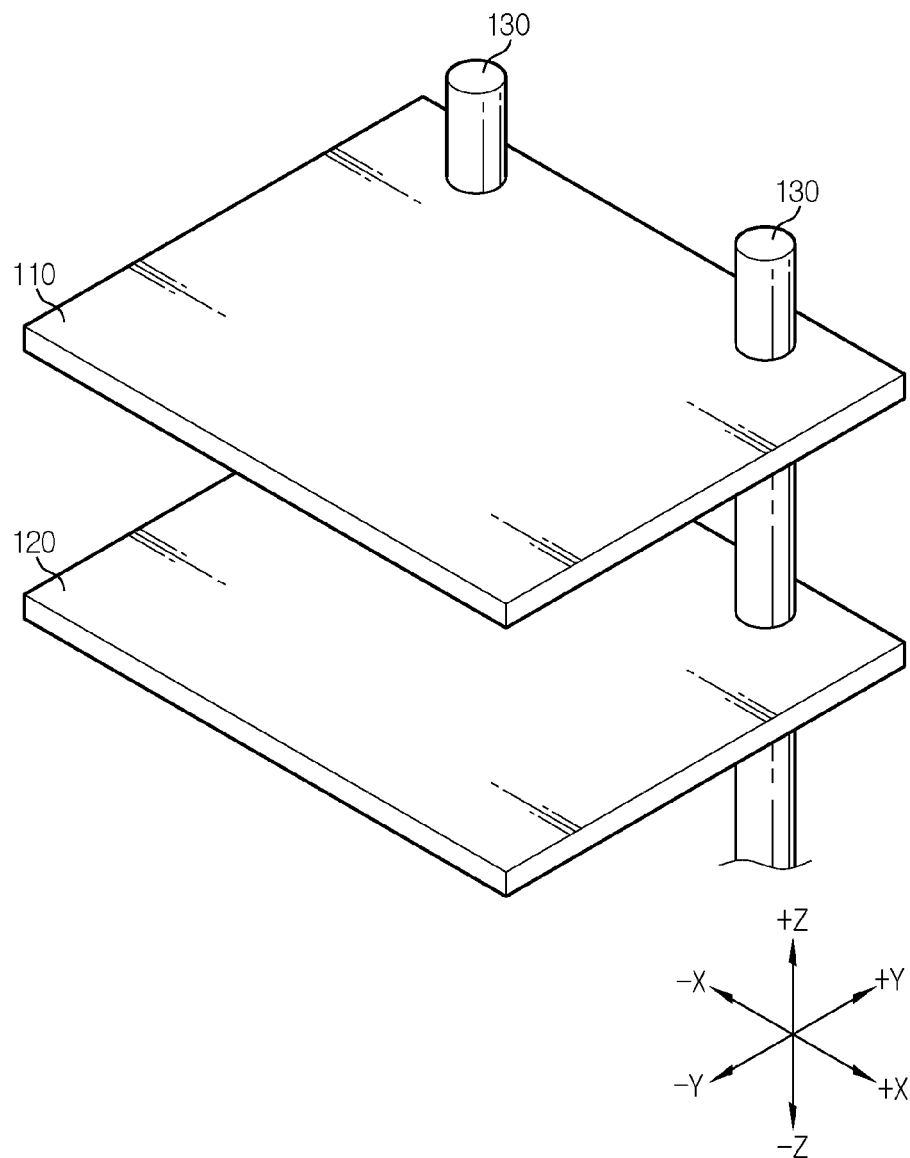
FIG. 2 is a diagram schematically showing only some components of the battery swelling inspection apparatus according to an embodiment of the present disclosure.

FIG. 1 is a diagram schematically showing a battery swelling inspection apparatus 100 according to an embodiment of the present disclosure. FIG. 2 is a diagram schematically showing only some components of the battery swelling inspection apparatus 100 according to an embodiment of the present disclosure.

Referring to FIG. 1, the battery swelling inspection apparatus 100 according to an embodiment of the present disclosure may include an upper plate 110, a lower plate 120, a fixing frame 130, a pressure measuring unit 140, and a pressure measuring pad 150.

Here, a battery 10 refers to one independent cell that has a negative electrode terminal and a positive electrode terminal and is physically separable. For example, one pouch-type lithium polymer cell may be regarded as a battery. In addition, the battery 10 may refer to a battery 10 module in which a plurality of battery 10 cells are connected in series and/or in parallel.

The upper plate 110 and the lower plate 120 may be configured in plate shape. In addition, the lower plate 120 is positioned to face the upper plate 110, and may be configured so that the battery 10 may be seated thereon.

For example, in the embodiment of FIG. 2, the upper plate 110 and the lower plate 120 are configured in a plate shape, and may be located to face each other. That is, the upper plate 110 and the lower plate 120 may be spaced apart by a predetermined distance, and the battery 10 may be interposed between the lower plate 120 and the upper plate 110. Specifically, the battery 10 may be seated on an upper portion of the lower plate 120 between the upper plate 110 and the lower plate 120.

The fixing frame 130 may be configured such that a portion of the upper plate 110 and a portion of the lower plate 120 are fixedly coupled thereto.

The fixing frame 130 may fix a portion of the upper plate 110 and a portion of the lower plate 120 so that the upper plate 110 and the lower plate 120 do not move or shake in a longitudinal direction (x-axis direction) and a width direction (y-axis direction).

In addition, the distance between the upper plate 110 and the lower plate 120 may be adjusted according to the battery interposed therebetween. That is, the positions at which the upper plate 110 and the lower plate 120 are fixedly coupled to the fixing frame 130 may be adjusted according to the battery 10. Since the positions at which the upper plate 110 and the lower plate 120 are fixedly coupled to the fixing frame 130 may be adjusted according to the battery 10, the battery swelling inspection apparatus 100 according to an embodiment of the present disclosure is not limited to the size of the battery 10, and may inspect swelling of various types of batteries 10.

The pressure measuring unit 140 may be configured to be located on at least one of an upper portion and a lower portion of the lower plate 120. In addition, the pressure measuring unit 140 may be configured to measure a first pressure value applied toward the lower plate 120 from the battery 10.

Figure 3:
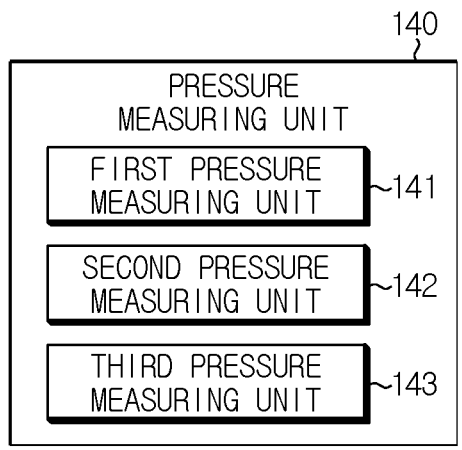
FIG. 3 is a diagram schematically showing a pressure measuring unit in the battery swelling inspection apparatus according to an embodiment of the present disclosure.

FIG. 3 is a diagram schematically showing the pressure measuring unit 140 in the battery swelling inspection apparatus 100 according to an embodiment of the present disclosure.

Referring to FIG. 3, the pressure measuring unit 140 may include at least one of a first pressure measuring unit 141 and a second pressure measuring unit 142.

Specifically, the first pressure measuring unit 141 and the second pressure measuring unit 142 may be units having different shapes. Since the first pressure measuring unit 141 and the second pressure measuring unit 142 have different shapes, positions at which they are provided in the battery swelling inspection apparatus 100 may be different from each other.

For example, the first pressure measuring unit 141 may have one pressure measuring element and be located on at least one part of the lower portion of the lower plate 120. Conversely, the second pressure measuring unit 142 may have a plurality of pressure measuring elements and be located on at least one part of the upper portion of the lower plate 120.

The pressure measuring pad 150 may be configured to include a coupling surface configured to be coupled to the lower surface of the upper plate 110 or the upper surface of the lower plate 120 and a measuring surface located at a side opposite to the coupling surface to face the battery 10 and configured such that a pressure is applied to at least a portion thereof.

Specifically, the pressure measuring pad 150 may have a pad shape in which one surface is a coupling surface and an opposite surface thereof is a measuring surface. The coupling surface may be coupled to the lower surface of the upper plate 110 or the upper surface of the lower plate 120, and the measuring surface may be in contact with the battery 10.

Preferably, the pressure measuring pad 150 may have a plate-shaped pressure measuring element. In addition, the coupling surface of the pressure measuring pad 150 may be coupled to the lower surface of the upper plate 110 or the upper surface of the lower plate 120, and the pressure of the battery 10 applied to the measuring surface may be measured through the plate-shaped pressure measuring element. For example, the pressure measuring element provided in the pressure measuring pad 150 may be a plate-shaped pressure-sensitive pressure sensor.

Figure 4:
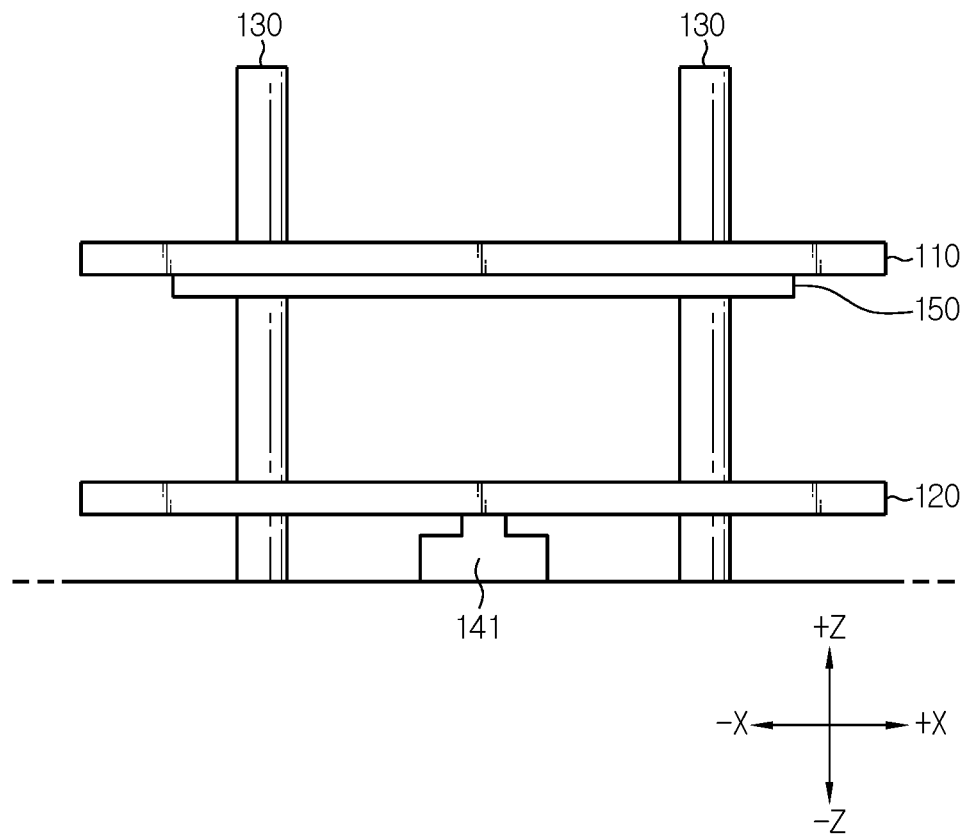
FIG. 4 is a diagram schematically showing the first embodiment of the battery swelling inspection apparatus according to an embodiment of the present disclosure.
Figure 5:
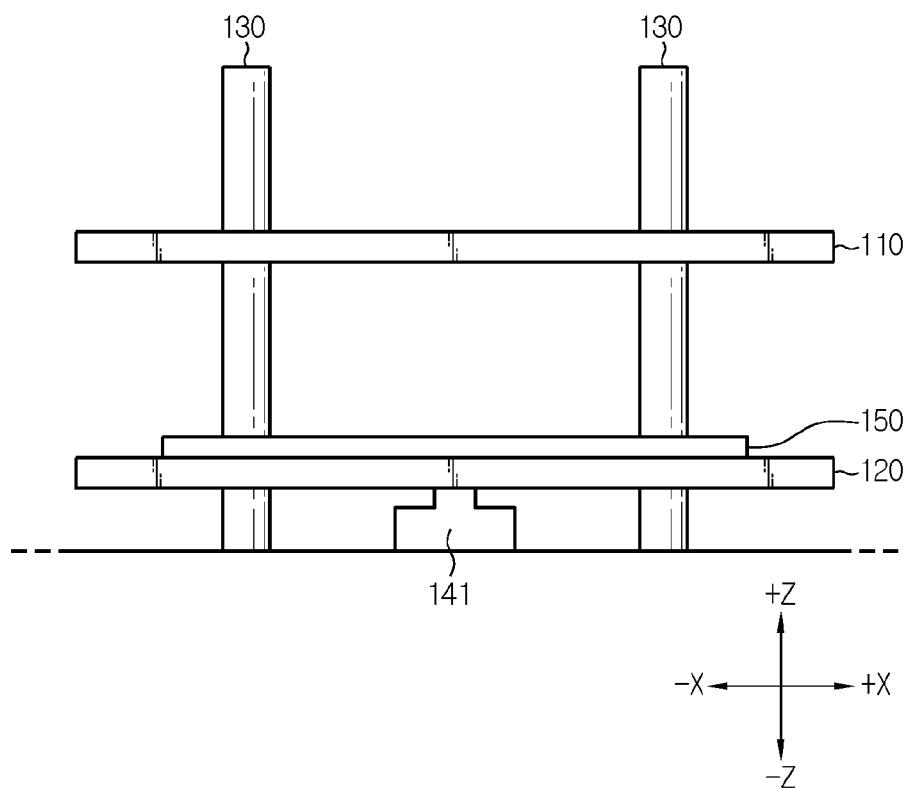
FIG. 5 is a diagram schematically showing the second embodiment of the battery swelling inspection apparatus according to an embodiment of the present disclosure.
Figure 6:
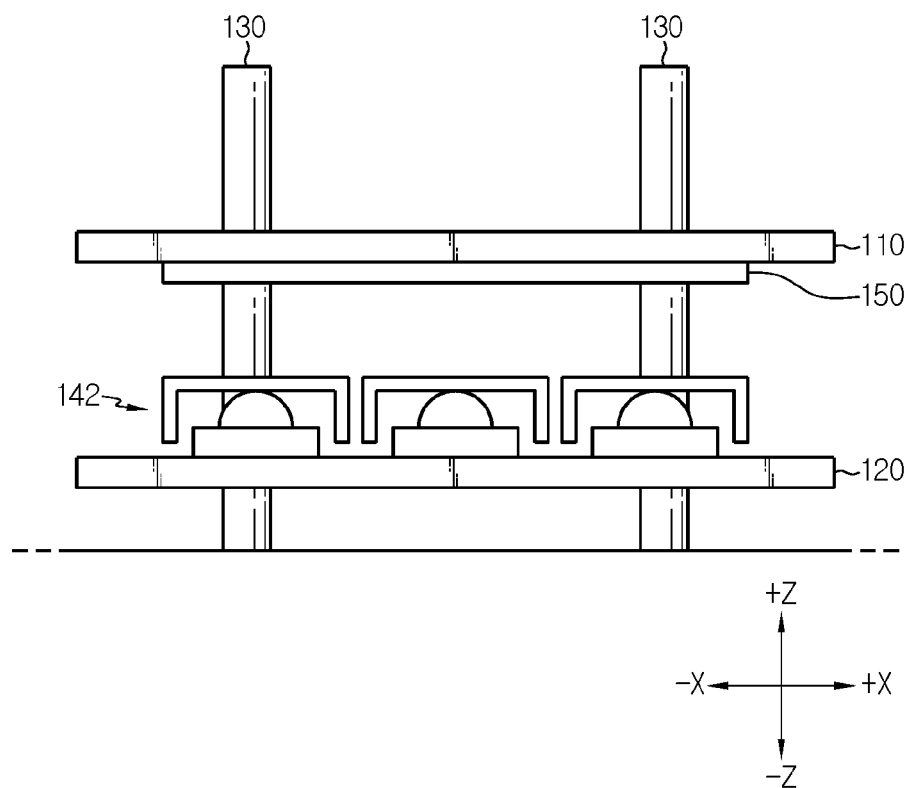
FIG. 6 is a diagram schematically showing the third embodiment of the battery swelling inspection apparatus according to an embodiment of the present disclosure.

FIG. 4 is a diagram schematically showing the first embodiment of the battery swelling inspection apparatus 100 according to an embodiment of the present disclosure. FIG. 5 is a diagram schematically showing the second embodiment of the battery swelling inspection apparatus 100 according to an embodiment of the present disclosure. FIG. 6 is a diagram schematically showing the third embodiment of the battery swelling inspection apparatus 100 according to an embodiment of the present disclosure.

Referring to FIGS. 4 and 5, the battery swelling inspection apparatus 100 may include a first pressure measuring unit 141 and a pressure measuring pad 150.

For example, in the embodiment of FIG. 4, the first pressure measuring unit 141 may be located below the lower plate 120, and a head thereof may be in contact with the lower surface of the lower plate 120. In addition, the pressure measuring pad 150 may be coupled to the lower surface of the upper plate 110. Specifically, the coupling surface of the pressure measuring pad 150 may be attached to the lower surface of the upper plate 110. In addition, the battery 10 may be interposed between the lower plate 120 and the pressure measuring pad 150. That is, the battery 10 may be seated on the upper surface of the lower plate 120.

In addition, in the embodiment of FIG. 5, the first pressure measuring unit 141 may be located below the lower plate 120, and the head thereof may be in contact with the lower surface of the lower plate 120. In addition, the pressure measuring pad 150 may be coupled to the upper surface of the lower plate 120. Specifically, the coupling surface of the pressure measuring pad 150 may be attached to the upper surface of the lower plate 120. In addition, the battery 10 may be interposed between the upper plate 110 and the pressure measuring pad 150. That is, the battery 10 may be seated on the contact surface of the pressure measuring pad 150.

Referring to FIG. 6, the battery swelling inspection apparatus 100 may include a second pressure measuring unit 142 and a pressure measuring pad 150.

For example, in the embodiment of FIG. 6, the second pressure measuring unit 142 is located on the lower plate 120 and be coupled to the upper surface of the lower plate 120. Specifically, the second pressure measuring unit 142 may be attached to the upper surface of the lower plate 120. In addition, the pressure measuring pad 150 may be coupled to the lower surface of the upper plate 110. Specifically, the coupling surface of the pressure measuring pad 150 may be attached to the lower surface of the upper plate 110. In addition, the battery 10 may be interposed between the second pressure measuring unit 142 and the pressure measuring pad 150. That is, the battery 10 may be seated on the second pressure measuring unit 142.

The pressure measuring pad 150 may be configured to measure a pressure distribution of the measuring surface based on a preset reference value and a pressure applied from the battery 10 to at least a portion of the measuring surface.

Specifically, the pressure measuring pad 150 may be configured to measure a relative pressure distribution with respect to the pressure applied to the measuring surface by using the reference value as a threshold value. That is, the pressure measuring pad 150 may measure a pressure distribution applied from the battery 10 to at least a portion of the measuring surface. Here, the pressure measuring pad 150 may measure a relative pressure distribution applied to the measuring surface based on the preset reference value.

For example, the preset reference value may be set to 0. In the embodiment of FIGS. 4 to 6, the battery 10 may be interposed, and the reference value may be set before charging and discharging of the battery 10 is performed. After that, a pressure may be applied to any portion of the measuring surface while the battery 10 is being charged and discharged. In this case, the pressure measuring pad 150 may measure a relative pressure value for the portion to which the pressure is applied as a positive real value.

As a specific example, it is assumed that the reference value is set to 0 and a pressure is applied from the battery 10 to a first portion, a second portion and a third portion of the measuring surface while the battery 10 is being charged and discharged. The pressure measuring pad 150 may measure a relative pressure value of the first portion, a relative pressure value of the second portion, and a relative pressure value of the third portion as +100, +200, and +300, respectively. In addition, the relative pressure value of the remaining portions of the measuring surface except for the first portion, the second portion and the third portion may be measured as 0. In this way, the pressure measuring pad 150 may measure a relative pressure distribution of the entire measuring surface.

The battery swelling inspection apparatus 100 according to an embodiment of the present disclosure may measure a first pressure value applied to the pressure measuring unit 140 from the battery 10 and a pressure distribution applied to the pressure measuring pad 150 from the battery 10 while the interposed battery 10 is being charged and discharged.

According to the battery swelling inspection apparatus 100, not only an absolute pressure applied from the battery 10 may be measured by the pressure measuring unit 140, but also a relative pressure distribution applied from the battery 10 may be measured by the pressure measuring pad 150. That is, in the process of inspecting swelling of the battery 10, since both the absolute pressure and the relative pressure distribution applied from the battery 10 may be considered, it is possible to detect not only the swelling pressure and swelling distribution for the entire battery 10 but also the swelling pressure and swelling distribution for each local area of the battery 10. Therefore, the battery swelling inspection apparatus 100 has an advantage of more accurately and precisely inspecting the swelling of the battery 10.

Referring to FIG. 1, the battery swelling inspection apparatus 100 according to an embodiment of the present disclosure may further include a processor 160.

Here, the processor 160 may optionally include application-specific integrated circuit (ASIC), other chipsets, logic circuits, registers, communication modems, data processing devices, and the like, known in the art, to execute various control logic performed in the present disclosure. Also, when the control logic is implemented in software, the processor 160 may be implemented as a set of program modules. At this time, the program module may be stored in a memory and executed by the processor 160. The memory may be located inside or out of the processor 160 and may be connected to the processor 160 by various well-known means.

The processor 160 may be connected to the pressure measuring unit 140 and the pressure measuring pad 150 to obtain the first pressure value and the pressure distribution.

Specifically, the processor 160 may receive the measured first pressure value from the pressure measuring unit 140 and receive the measured pressure distribution from the pressure measuring pad 150.

In addition, the processor 160 may be configured to calculate a plurality of second pressure values applied to each portion of the measuring surface according to the obtained first pressure value and the obtained pressure distribution.

Specifically, the processor 160 may be configured to calculate an absolute pressure value applied to the measuring surface by substituting the pressure distribution according to the first pressure value, and calculate each of the plurality of second pressure values based on the calculated absolute pressure value and the pressure distribution.

For example, the pressure measuring unit 140 may measure a total pressure value applied from the battery 10 as the first pressure value. For example, the first pressure value may be measured as an absolute pressure value between 0 and 100 [N]. In addition, the pressure measuring pad 150 may measure a relative pressure distribution applied from the battery 10 to each portion of the measuring surface.

Therefore, the processor 160 may calculate a second pressure value applied to each portion of the measuring surface of the pressure measuring pad 150 based on the first pressure value, which is the total pressure value applied from the battery 10, and the relative pressure distribution applied from the battery 10. Here, the second pressure value may be an absolute pressure value between 0 and 100 [N], like the first pressure value.

For example, it is assumed that the pressure measuring pad 150 measures the relative pressure value of the first portion of the measuring surface, the relative pressure value of the second portion, and the relative pressure value of the third portion as +100, +200, and +300, respectively, and the pressure measuring unit 140 measures the first pressure value applied from battery 10 as 6 [N]. The processor 160 may calculate the second pressure value for the first portion as 1 [N] based on the relative pressure value of the first portion of the measuring surface and the first pressure value. Similarly, the processor 160 may calculate the second pressure value for the second portion of the measuring surface as 2 [N], and calculate the second pressure value for the third portion of the measuring surface as 3 [N]. In addition, the processor 160 may calculate the second pressure value for the remaining portions of the measuring surface except for the first portion, the second portion, and the third portion as 0 [N].

The processor 160 may be configured to detect whether the battery 10 swells based on the plurality of calculated second pressure values.

Preferably, the processor 160 may be configured to detect at least one of a swelling distribution of the battery 10 and a swelling pressure of each region based on the obtained pressure distribution and the plurality of calculated second pressure values.

Here, the swelling distribution of the battery 10 is detected by the pressure distribution measured by the pressure measuring pad 150 and may be a distribution about the degree of swelling while the battery 10 is charged and discharged. As described above, the swelling distribution may be expressed as a relative pressure distribution based on a reference value.

In addition, the swelling pressure of each region may be a value obtained by substituting the degree of swelling of each region of the battery 10 into an absolute pressure based on the pressure distribution obtained by the processor 160 and the calculated second pressure value. That is, if the swelling distribution of the battery 10 represents a relative pressure distribution of each region of the battery 10, the swelling pressure of each region represents an absolute pressure value of each region of the battery 10.

That is, the battery swelling inspection apparatus 100 according to an embodiment of the present disclosure may not only detect the relative pressure distribution (the swelling distribution) of each region of the battery 10, but also detect the pressure value of each region of the battery 10 (the swelling pressure of each region). Therefore, the swelling of the battery 10 may be inspected in more various aspects. In addition, since both the absolute pressure value (the first pressure value) and the relative pressure distribution of each region of the battery 10 are considered while inspecting the swelling of the battery 10, the accuracy of the swelling inspection may be improved.

Hereinafter, the first embodiment and the second embodiment of the battery swelling inspection apparatus 100 will be described in detail with reference to FIGS. 4 and 5.

The pressure measuring unit 140 may include a first pressure measuring unit 141.

For example, the first pressure measuring unit 141 may be one pressure measuring element. That is, the first pressure measuring unit 141 may be one pressure sensor.

In addition, the first pressure measuring unit 141 may be located below the lower plate 120, and a head thereof may be configured to be located to face the lower surface of the lower plate 120.

For example, the first pressure measuring unit 141 may be a load cell including a head and a body. In addition, the head of the first pressure measuring unit 141 may be in contact with the lower surface of the lower plate 120.

In addition, the first pressure measuring unit 141 may be configured to measure the first pressure value applied to the head.

In the embodiment of FIGS. 4 and 5, the first pressure measuring unit 141 may measure the first pressure value applied from the battery 10 to the head through the lower plate 120. That is, the measured first pressure value may be a total pressure value applied by the swelling of the battery 10.

For example, it is assumed that the first pressure value measured by the first pressure measuring unit 141 is 6 [N]. Since the first pressure measuring unit 141 may measure one absolute pressure value (6 [N]) applied by the swelling of the battery 10, there is a limit in measuring a local pressure of the battery 10. Accordingly, the processor 160 may calculate the second pressure value by substituting the pressure distribution of the battery 10 measured by the pressure measuring pad 150 into the absolute pressure value based on the first pressure value (6 [N]) measured by the first pressure measuring unit 141. In addition, the processor 160 may detect a swelling pressure of each region according to the calculated second pressure value of each region of the battery 10.

Hereinafter, the third embodiment of the battery swelling inspection apparatus 100 will be described in detail with reference to FIGS. 6 to 9.

Referring to FIG. 6, the pressure measuring pad 150 may be configured such that the coupling surface is coupled to the lower surface of the upper plate 110. In addition, the pressure measuring unit 140 may include a second pressure measuring unit 142 coupled to the upper surface of the lower plate 120. That is, the pressure measuring pad 150 may be coupled to the lower surface of the upper plate 110, and the second pressure measuring unit 142 may be coupled to the upper surface of the lower plate 120. In addition, the battery 10 may be interposed between the pressure measuring pad 150 and the second pressure measuring unit 142.

Specifically, the pressure measuring unit 140 may include a second pressure measuring unit 142 configured to have a plurality of pressure measuring elements coupled to the upper surface of the lower plate 120. That is, the second pressure measuring unit 142 may include a plurality of pressure measuring elements. In addition, each of the plurality of pressure measuring elements may measure a unit pressure value applied from the battery 10.

Figure 7:
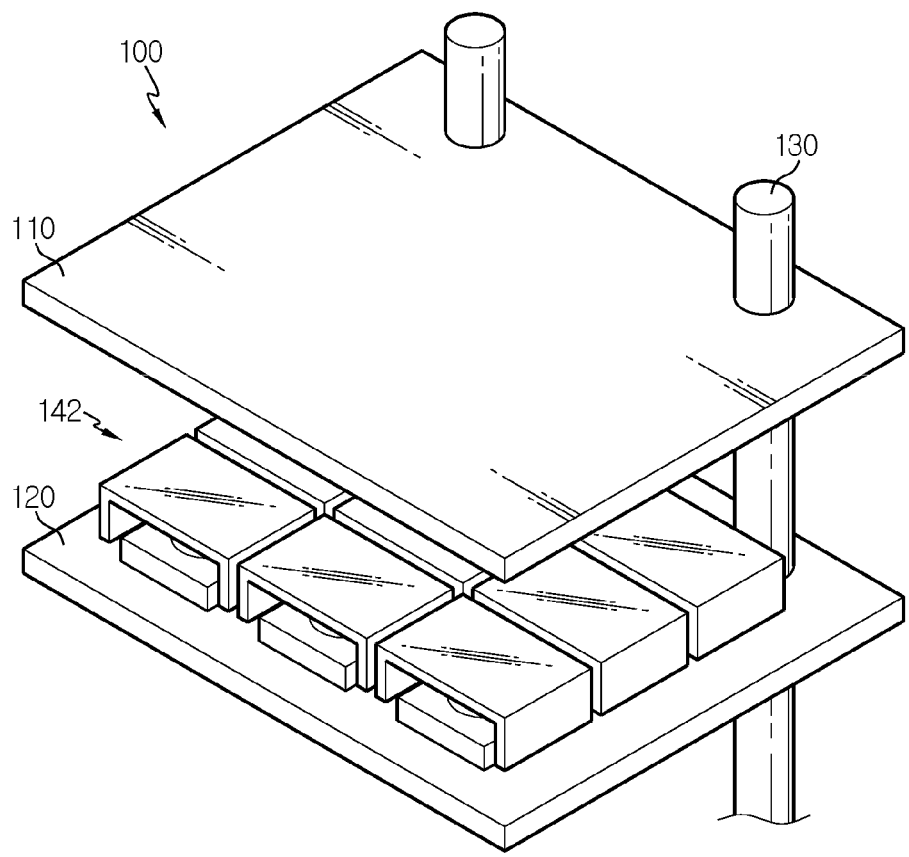
FIG. 7 is a diagram schematically showing one embodiment of a second pressure measuring unit included in the battery swelling inspection apparatus according to an embodiment of the present disclosure.

FIG. 7 is a diagram schematically showing one embodiment of the second pressure measuring unit 142 included in the battery swelling inspection apparatus 100 according to an embodiment of the present disclosure.

For example, referring to FIG. 7, the second pressure measuring unit 142 including a plurality of pressure measuring elements may be coupled to the upper surface of the lower plate 120.

In addition, the second pressure measuring unit 142 may be configured to measure the first pressure value based on the unit pressure value measured by each of the plurality of pressure measuring elements. That is, the total sum of the plurality of unit pressure values respectively measured by the plurality of pressure measuring elements may be the first pressure value.

Figure 8:
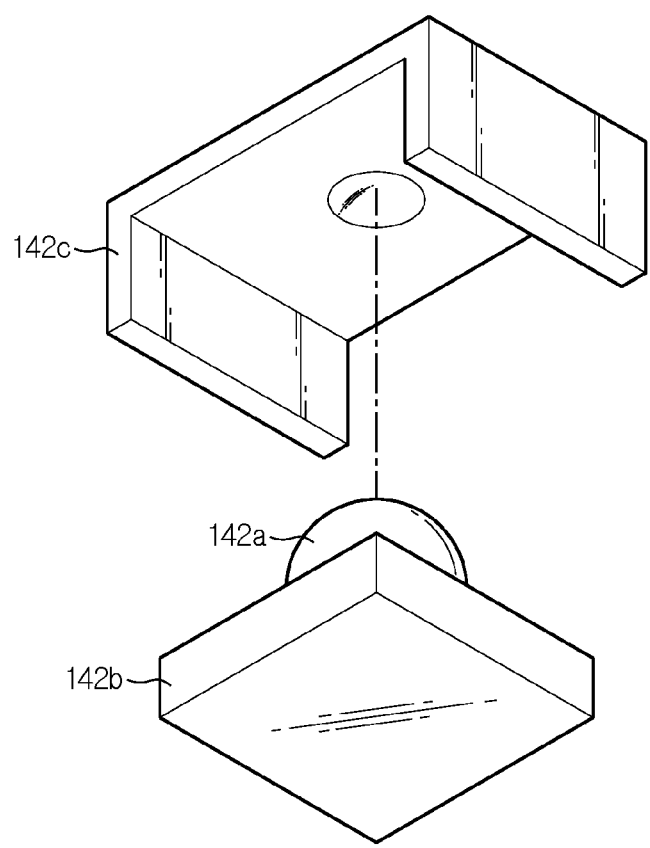
FIG. 8 schematically shows an exemplary configuration of a pressure measuring element included in the second pressure measuring unit of FIG. 7.

FIG. 8 schematically shows an exemplary configuration of a pressure measuring element included in the second pressure measuring unit 142 of FIG. 7.

Each of the plurality of pressure measuring elements includes a body 142b configured to be coupled to the upper surface of the lower plate 120; a head 142a coupled to the body 142b and configured such that a pressure is applied thereto from the battery 10; and a cap 142c configured such that a central portion of a lower surface thereof is attached to the head 142a.

For example, the head 142a and the cap 142c of the pressure measuring element may be made of magnetic materials that may be attached to each other. More preferably, the top end of the head 142a of the pressure measuring element and the central portion of the lower surface of the cap 142c may be made of a magnetic material. Therefore, the central portion of the lower surface of the cap 142c may be attached to the top end of the head 142a by magnetism. In addition, the cap 142c may be detachably attached to the head 142a.

In the embodiment of FIG. 8, at least a portion of the head 142a of the pressure measuring element may be configured in the form of an angled shape or a curved surface. Preferably, the pressure measuring element may be configured such that at least a portion of the head 142a is in the form of a curved surface. Therefore, when a pressure is applied from the battery 10 to the cap 142c so that the cap 142c is tilted, it is possible to minimize that the movement of the cap 142c is restrained due to the shape of the head 142a. That is, since the head 142a of the pressure measuring element is configured in a shape that allows the cap 142c to be easily tilted, the cap 142c may be easily tilted in response to the pressure applied from the battery 10. In addition, the cap 142c and the top end of the head 142a may be made of a magnetic material, so that the cap 142c may easily return to its original shape after being tilted.

Figure 9:
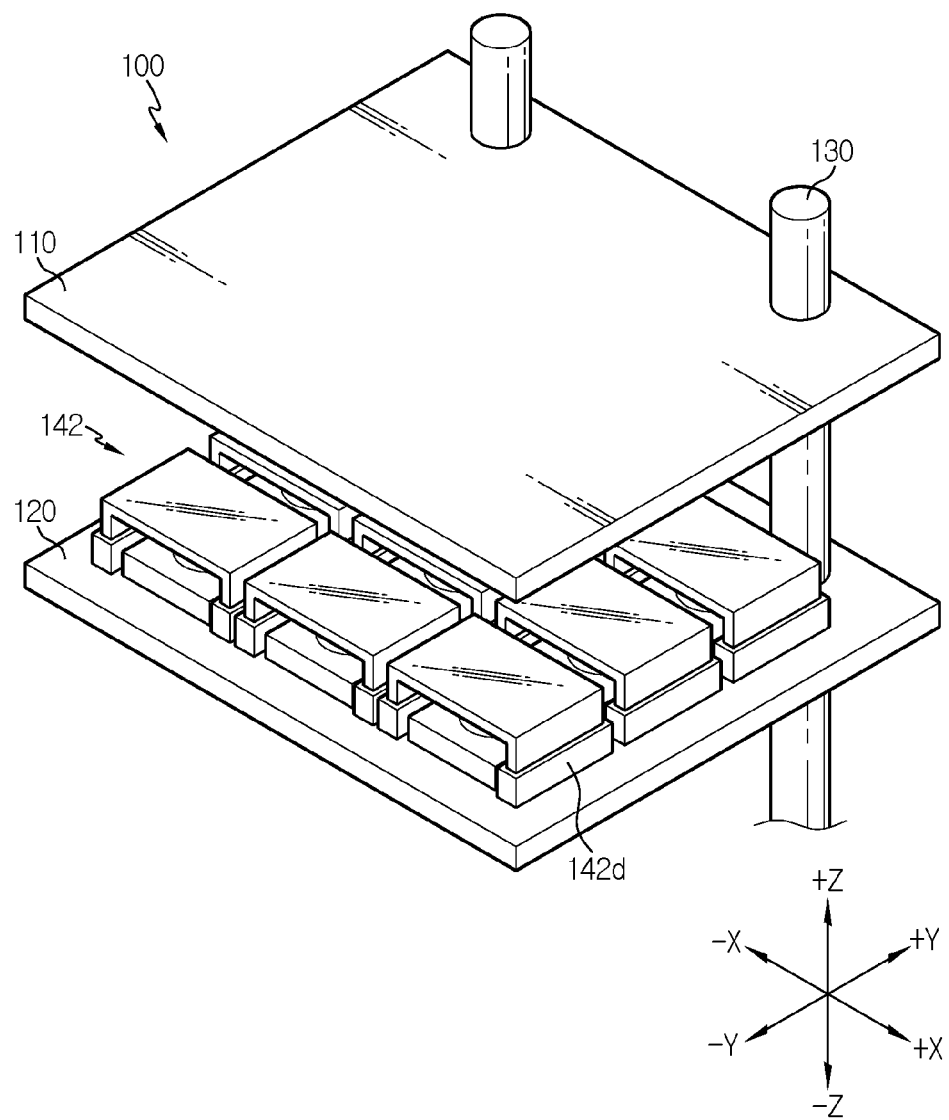
FIG. 9 is a diagram schematically showing another embodiment of the second pressure measuring unit included in the battery swelling inspection apparatus according to an embodiment of the present disclosure.

FIG. 9 is a diagram schematically showing another embodiment of the second pressure measuring unit 142 included in the battery swelling inspection apparatus 100 according to an embodiment of the present disclosure.

Referring to FIG. 9, the second pressure measuring unit 142 may further include a support member 142d. The support member 142d may be configured such that one end thereof is attached to the upper surface of the lower plate 120 and a hollow or groove is formed therein so that a portion of the cap 142c is inserted.

Since the portion of the cap 142c inserted into the support member 142d may move only inside the support member 142d, even if the cap 142c is tilted by the pressure applied from the battery 10, the contact between adjacent caps 142c may be blocked. Since the contact between the caps 142c of the plurality of adjacent pressure measuring elements is prevented by the support member 142d, the unit pressure value measured by each of the plurality of pressure measuring elements may be more accurate.

That is, the plurality of pressure measuring elements included in the second pressure measuring unit 142 may be adopted to have a structure capable of more accurately calculating the unit pressure value. Therefore, the battery swelling inspection apparatus 100 according to an embodiment of the present disclosure may more accurately detect the swelling distribution of the battery 10 and the swelling pressure of each region based on the first pressure value calculated by this second pressure measuring unit 142.

Figure 10:
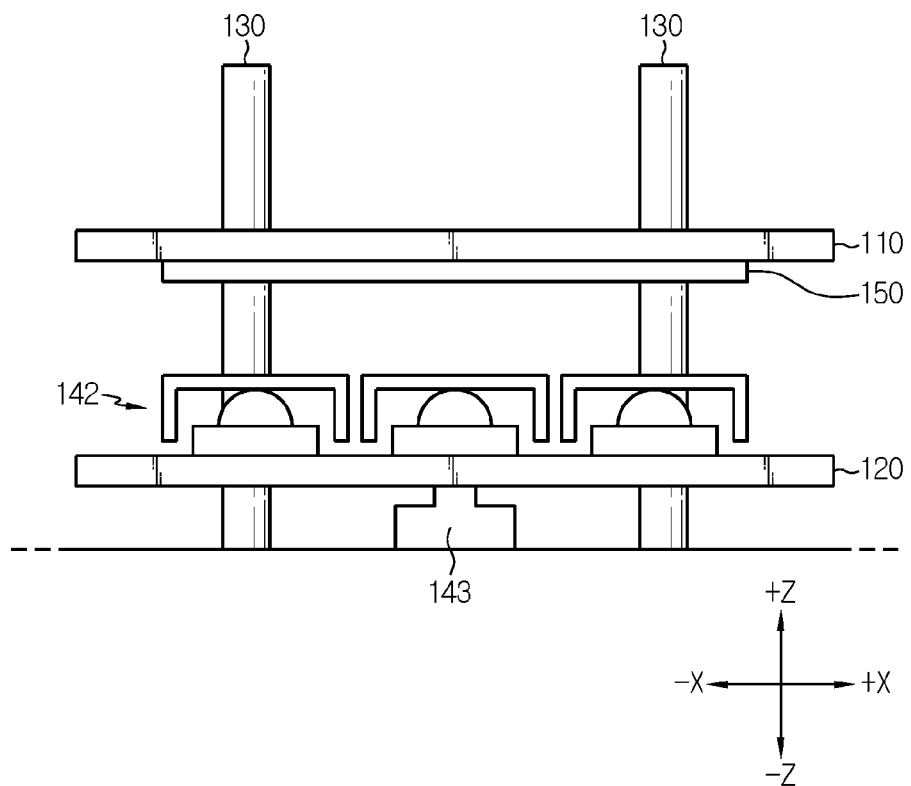
FIG. 10 is a diagram schematically showing the fourth embodiment of the battery swelling inspection apparatus according to an embodiment of the present disclosure.
Figure 11:
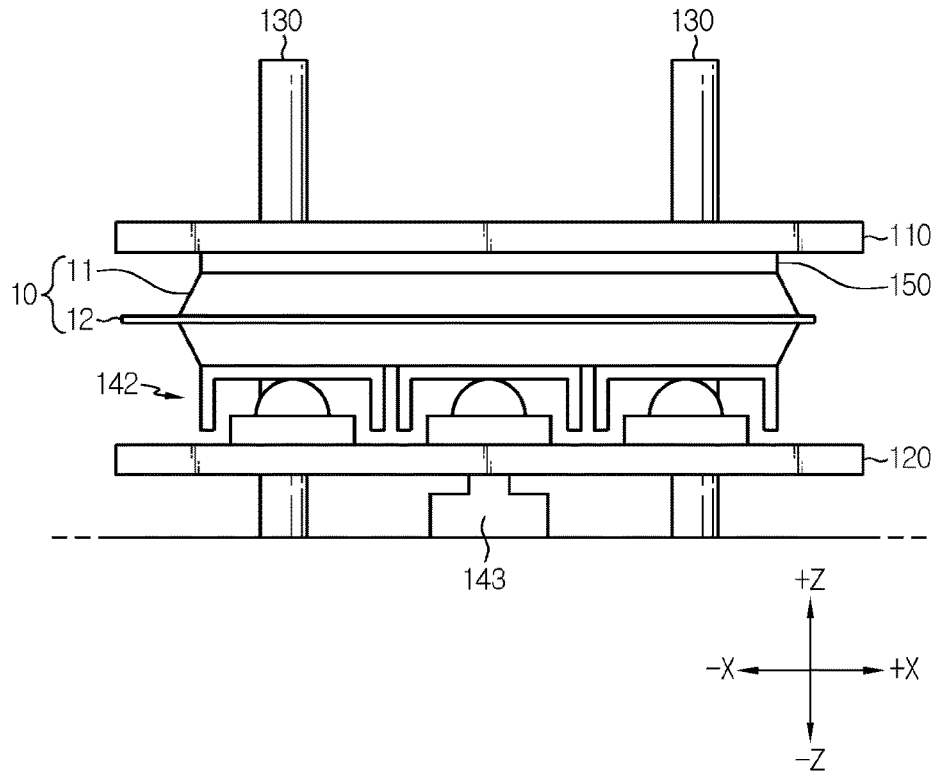
FIG. 11 is a diagram schematically showing an exemplary configuration in which a battery is interposed in the fourth embodiment of FIG. 10.

FIG. 10 is a diagram schematically showing the fourth embodiment of the battery swelling inspection apparatus 100 according to an embodiment of the present disclosure. FIG. 11 is a diagram schematically showing an exemplary configuration in which the battery 10 is interposed in the fourth embodiment of FIG. 10.

For example, in the embodiment of FIGS. 10 and 11, the pressure measuring unit 140 may further include a third pressure measuring unit 143 located below the lower plate 120 so that a head thereof is located to face the lower surface of the lower plate 120, and configured to measure a third pressure value applied to the head.

Here, the third pressure measuring unit 143 may be the same as the first pressure measuring unit 141 of the embodiment of FIGS. 4 and 5. However, for the description distinguished from the former embodiment, hereinafter, it will be described that the second pressure measuring unit 142 and the third pressure measuring unit 143 are included in the pressure measuring unit 140.

In the embodiment of FIGS. 10 and 11, the pressure measuring unit 140 may include the second pressure measuring unit 142 and the third pressure measuring unit 143 together.

Specifically, the second pressure measuring unit 142 may be coupled to the upper surface of the lower plate 120, and the third pressure measuring unit 143 may be located below the lower plate 120. In this case, the second pressure measuring unit 142 may measure the first pressure value based on the plurality of unit pressure values respectively applied to the plurality of pressure measuring elements from the battery 10. In addition, the third pressure measuring unit 143 may measure the third pressure value applied through the lower plate 120 from the battery 10.

The processor 160 may be connected to the second pressure measuring unit 142 to obtain the first pressure value, be connected to the third pressure measuring unit 143 to obtain the third pressure value, and be configured to correct the third pressure value based on the first pressure value. The processor 160 may be configured to calculate the plurality of second pressure values based on the corrected third pressure value and the pressure distribution.

That is, the processor 160 may correct the third pressure value based on the first pressure value obtained from the second pressure measuring unit 142 before calculating the second pressure value of each region of the battery 10 based on the third pressure value obtained from the third pressure measuring unit 143 and the pressure distribution of the battery 10 obtained from the pressure measuring pad 150.

For example, referring to FIG. 11, the battery 10 may include an accommodating portion 11 in which an electrode assembly and an electrolyte are provided, and a sealing portion 12. Here, the electrode assembly may be an assembly including a positive electrode plate, a separator and a negative electrode plate. In addition, when the accommodating portion 11 of the battery 10 swells during the charging and discharging of the battery 10, a swelling pressure of the battery 10 may be applied toward the upper plate 110 and the lower plate 120.

Since the measuring surface of the pressure measuring pad 150 is in direct contact with the battery 10, the swelling pressure of the battery 10 applied to the pressure measuring pad 150 may not be lost. That is, it may not be required to correct the pressure distribution of the battery 10 measured by the pressure measuring pad 150.

However, since the swelling pressure of the battery 10 is applied to the third pressure measuring unit 143 through the second pressure measuring unit 142 and the lower plate 120, the third pressure value measured by the third pressure measuring unit 143 and the actual swelling pressure of the battery 10 may be slightly different. For example, when the swelling pressure of the battery 10 is applied to the second pressure measuring unit 142, the swelling pressure of the battery 10 may be lost due to the friction generated between the head 142a and the cap 142c and between the head 142a and the body 142b of the plurality of pressure measuring elements. In addition, the swelling pressure of the battery 10 may also be lost due to the tension of the lower plate 120 and/or the friction between the lower plate 120 and the fixing frame 130.

In addition, the second pressure measuring unit 142 includes a plurality of pressure measuring elements, and a gap may exist between the caps 142c of the plurality of pressure measuring elements. That is, if a pressure is applied to a portion of the battery 10 corresponding to the gap, the first pressure value measured by the second pressure measuring unit 142 may also be slightly different from the swelling pressure of the battery 10.

Accordingly, the processor 160 may more accurately inspect the swelling of the battery 10 by correcting the third pressure value based on the first pressure value and calculating the second pressure value based on the corrected third pressure value.

For example, the processor 160 may calculate an average value of the first pressure value and the third pressure value and correct the third pressure value into the calculated average value. In this case, since both the third pressure value calculated through the third pressure measuring unit 143 and the first pressure value calculated through the second pressure measuring unit 142 may be considered, the corrected third pressure value may be a value very close to the swelling pressure of the battery 10. Therefore, according to the corrected third pressure value and the pressure distribution measured by the pressure measuring pad 150, the swelling pressure of each region may be more accurately calculated.

That is, the battery swelling inspection apparatus 100 according to an embodiment of the present disclosure has an advantage of more accurately inspecting the swelling of the battery 10 by using all of the second pressure measuring unit 142, the third pressure measuring unit 143 and the pressure measuring pad 150.

Meanwhile, referring to FIG. 11, since the pressure measuring pad 150 must measure the pressure distribution of each region of the battery 10, the area of the measuring surface of the pressure measuring pad 150 may be greater than or equal to the area of the accommodating portion 11. Specifically, the area of the measuring surface of the pressure measuring pad 150 may be equal to or greater than the area of the accommodating portion 11 in contact therewith in the +Z direction.

Similarly, since the second pressure measuring unit 142 also must measure the first pressure value of each region of the battery 10, the area of the second pressure measuring unit 142 in the +Z direction may be greater than or equal to the area of the accommodating portion 11 in contact therewith in the −Z direction.

A battery manufacturing device according to another embodiment of the present disclosure may include the battery swelling inspection apparatus 100 according to an embodiment of the present disclosure.

For example, the battery manufacturing device may be used in a test process during the manufacturing procedure for the battery 10. Preferably, the test process is a process performed after an aging process for the battery 10 is completed, and may be a process of selecting a defective battery 10 while charging and discharging the battery 10 several times. In this process, the battery 10 is interposed in the battery swelling inspection apparatus 100, and while the battery 10 is repeatedly charged and discharged, the processor 160 may detect the swelling distribution of the battery 10 and the swelling pressure of each region.

Therefore, according to the battery manufacturing device according to another embodiment of the present disclosure, there is an advantage in that battery 10 with a defect (particularly, a defect related to swelling) may be selected before the battery 10 is shipped.

Figure 12:
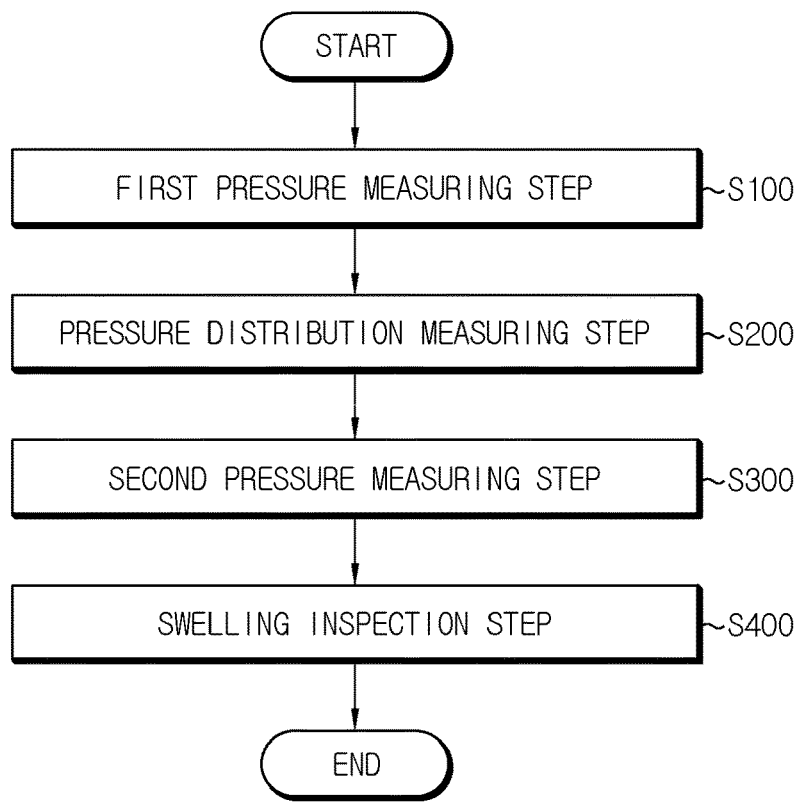
FIG. 12 is a diagram schematically illustrating a battery swelling inspection method according to another embodiment of the present disclosure.

FIG. 12 is a diagram schematically illustrating a battery swelling inspection method according to another embodiment of the present disclosure.

The battery swelling inspection method is a method of inspecting the swelling of the battery 10 interposed between the upper plate 110 and the lower plate 120 configured in a plate shape, and each step of the method may be performed by the battery swelling inspection apparatus 100.

The first pressure measuring step (S100) may be a step of measuring the first pressure value applied from the battery 10 toward the lower plate 120. Specifically, the first pressure measuring step (S100) may be performed by the pressure measuring unit 140 located on at least one of the upper portion or the lower portion of the lower plate 120 and configured to measure the first pressure value applied from the battery 10 toward the lower plate 120.

The first pressure value measured by the pressure measuring unit 140 may be an absolute pressure value applied to the pressure measuring unit 140 from the battery 10.

The pressure distribution measuring step (S200) may be a step of measuring the pressure distribution of the measuring surface based on the pressure applied to at least a portion of the measuring surface of the pressure measuring pad 150 from the battery 10 and a preset reference value. Specifically, the pressure distribution measuring step (S200) may be performed by the pressure measuring pad 150 having a coupling surface configured to be coupled to the lower surface of the upper plate 110 or the upper surface of the lower plate 120 and a measuring surface located at a side opposite to the coupling surface to face the battery 10 and configured such that a pressure is applied to at least portion thereof.

The pressure distribution measured by the pressure measuring pad 150 may be a distribution for the relative pressure applied to each portion of the measuring surface of the pressure measuring pad 150 from the battery 10.

The second pressure measuring step (S300) is a step of calculating a plurality of second pressure values applied to each portion of the measuring surface according to the first pressure value and the pressure distribution. Specifically, the second pressure calculation step may be performed by the processor 160.

The processor 160 may obtain the first pressure value from the pressure measuring unit 140 and the pressure distribution from the pressure measuring pad 150. In addition, the processor 160 may calculate the second pressure value (the absolute pressure value) applied to each portion of the measuring surface from the battery 10 based on the first pressure value and the pressure distribution.

The swelling inspection step (S400) is a step of detecting whether the battery 10 swells based on the plurality of calculated second pressure values. Specifically, the swelling inspection step (S400) may be performed by the processor 160.

The processor 160 may detect the swelling distribution of the battery 10 and the swelling pressure of each region based on the plurality of calculated second pressure values.

The embodiments of the present disclosure described above may not be implemented only through an apparatus and a method, but may be implemented through a program that realizes a function corresponding to the configuration of the embodiments of the present disclosure or a recording medium on which the program is recorded. The program or recording medium may be easily implemented by those skilled in the art from the above description of the embodiments.

The present disclosure has been described in detail. However, it should be understood that the detailed description and specific examples, while indicating preferred embodiments of the disclosure, are given by way of illustration only, since various changes and modifications within the scope of the disclosure will become apparent to those skilled in the art from this detailed description.

Additionally, many substitutions, modifications and changes may be made to the present disclosure described hereinabove by those skilled in the art without departing from the technical aspects of the present disclosure, and the present disclosure is not limited to the above-described embodiments and the accompanying drawings, and each embodiment may be selectively combined in part or in whole to allow various modifications.

REFERENCE SIGNS

10: battery
11: accommodating portion
12: sealing portion
100: battery swelling inspection apparatus
110: upper plate
120: lower plate
130: fixing frame
140: pressure measuring unit
141: first pressure measuring unit
142: second pressure measuring unit
142*a*: head
142*b*: body
142*c*: cap
142*d*: support member
143: third pressure measuring unit
150: pressure measuring pad
160: processor

What is claimed is:
1. A battery swelling inspection apparatus, comprising:
an upper plate configured in a plate shape;
a lower plate configured in a plate shape and located to face the upper plate, the lower plate being configured such that a battery is to be seated thereon;
a fixing frame configured such that a portion of the upper plate and a portion of the lower plate are fixedly coupled thereto;
a pressure measurer located on at least one of an upper portion and a lower portion of the lower plate and configured to measure a first pressure value applied from the battery toward the lower plate;
a pressure measuring pad having a coupling surface and a measuring surface, the coupling surface being configured to be coupled to a lower surface of the upper plate or an upper surface of the lower plate and the measuring surface being located at a side opposite to the coupling surface to face the battery and configured such that a pressure is applied from the battery to at least a portion of the measuring surface, the pressure measuring pad further being configured to measure a pressure distribution of the measuring surface based on the pressure applied from the battery to at least the portion of the measuring surface; and
a processor connected to the pressure measurer and the pressure measuring pad to obtain the first pressure value and the pressure distribution, and the processor being configured to calculate a plurality of second pressure values applied to each portion of the measuring surface according to the obtained first pressure value and the obtained pressure distribution and to detect whether the battery swells based on the plurality of calculated second pressure values, and
wherein the processor is configured to calculate an absolute pressure value applied to the measuring surface by substituting the pressure distribution according to the first pressure value and calculate the plurality of second pressure values based on the calculated absolute pressure value and the pressure distribution, respectively.

2. The battery swelling inspection apparatus according to claim 1, wherein the pressure measurer includes a first pressure measurer located below the lower plate and having a head located to face a lower surface of the lower plate, the first pressure measurer being configured to measure the first pressure value applied to the head.

3. The battery swelling inspection apparatus according to claim 1, wherein the pressure measuring pad is configured such that the coupling surface is coupled to the lower surface of the upper plate, and
wherein the pressure measurer includes a second pressure measurer having a plurality of pressure measuring elements coupled to the upper surface of the lower plate and configured to measure the first pressure value based on a unit pressure value measured by each of the plurality of pressure measuring elements.

4. The battery swelling inspection apparatus according to claim 3, wherein the pressure measurer further includes a third pressure measurer located below the lower plate and having a head located to face a lower surface of the lower plate, the third pressure measurer being configured to measure a third pressure value applied to the head.

5. The battery swelling inspection apparatus according to claim 4, wherein the processor is connected to the second pressure measurer to obtain the first pressure value, is connected to the third pressure measurer to obtain the third pressure value, and is configured to correct the third pressure value based on the first pressure value.

6. The battery swelling inspection apparatus according to claim 5, wherein the processor is configured to calculate the plurality of second pressure values based on the corrected third pressure value and the pressure distribution.

7. The battery swelling inspection apparatus according to claim 3, wherein each measuring element includes a body configured to be coupled to the upper surface of the lower plate, a head coupled to the body and configured such that a pressure is applied thereto from the battery, and a cap configured such that a central portion of a lower surface thereof is attached to the head.

8. The battery swelling inspection apparatus according to claim 3, wherein the plurality of measuring elements are arranged in a matrix pattern on the upper surface of the lower plate.

9. The battery swelling inspection apparatus according to claim 1, wherein the processor is configured to detect at least one of a swelling distribution of the battery and a swelling pressure of each region of the battery, based on the obtained pressure distribution and the plurality of calculated second pressure values.

10. The battery swelling inspection apparatus according to claim 1, wherein the pressure measuring pad is configured to measure a relative pressure distribution with respect to the pressure applied to the measuring surface by using the reference value as a threshold value.

11. A battery manufacturing device, comprising the battery swelling inspection apparatus according to claim 1.

12. The battery swelling inspection apparatus according to claim 1, wherein the plurality of calculated second pressure values are less than the first pressure value.

13. A battery swelling inspection method for inspecting swelling of a battery interposed between an upper plate and a lower plate configured in a plate shape, the battery swelling inspection method comprising:
 a first pressure measuring operation, by a pressure measurer located on at least one of an upper portion and a lower portion of the lower plate and configured to measure a first pressure value applied from the battery toward the lower plate, of measuring the first pressure value applied from the battery toward the lower plate;
 a pressure distribution measuring operation, by a pressure measuring pad having a coupling surface configured to be coupled to a lower surface of the upper plate or an upper surface of the lower plate and a measuring surface located at a side opposite to the coupling surface to face the battery and configured such that a pressure is applied to at least a portion thereof, of measuring a pressure distribution of the measuring surface based on the pressure applied from the battery to at least a portion of the measuring surface;
 a second pressure measuring operation, by a processor, of calculating a plurality of second pressure values applied to each portion of the measuring surface according to the first pressure value and the pressure distribution;
 a calculating operation, by the processor, of calculating an absolute pressure value applied to the measuring surface by substituting the pressure distribution according to the first pressure value and further calculating the plurality of second pressure values based on the calculated absolute pressure value and the pressure distribution, respectively; and
 a swelling inspection operation, by the processor, of detecting whether the battery swells based on the plurality of calculated second pressure values.

14. The battery swelling inspection method according to claim 13, wherein the plurality of calculated second pressure values are less than the first pressure value.

* * * * *